US005736489A

United States Patent [19]
Kozlowski

[11] Patent Number: 5,736,489
[45] Date of Patent: Apr. 7, 1998

[54] METHOD OF PRODUCING MELT-PROCESSED POLYCRYSTALLINE $YBA_2CU_3O_Y$ (123) SUPERCONDUCTORS

[75] Inventor: Gregory Kozlowski, Centerville, Ohio

[73] Assignee: Wright State University, Dayton, Ohio

[21] Appl. No.: 797,600

[22] Filed: Feb. 7, 1997

[51] Int. Cl.⁶ .............................. B32B 9/00; H01L 39/24
[52] U.S. Cl. .................. 505/239; 505/238; 505/452; 505/733; 505/781; 428/930; 427/62
[58] Field of Search .......................... 505/450, 452, 505/239, 733, 238, 781; 427/62; 428/930

[56] References Cited

U.S. PATENT DOCUMENTS

| | | |
|---|---|---|
| 5,231,076 | 7/1993 | Jeong et al. . |
| 5,240,903 | 8/1993 | Shimoyama et al. . |
| 5,248,660 | 9/1993 | Lee et al. ............................. 505/450 |
| 5,273,959 | 12/1993 | Lambert et al. . |
| 5,278,137 | 1/1994 | Morita et al. . |
| 5,306,700 | 4/1994 | Hojaji . |
| 5,525,585 | 6/1996 | Suh et al. . |

FOREIGN PATENT DOCUMENTS

| | | |
|---|---|---|
| 2-38311 | 2/1990 | Japan . |
| 2-204358 | 8/1990 | Japan . |
| 3-93619 | 4/1991 | Japan . |
| 3-112810 | 5/1991 | Japan . |
| 3-257018 | 11/1991 | Japan . |
| 6-72712 | 3/1994 | Japan . |
| 1526290 | 11/1993 | Russian Federation . |

OTHER PUBLICATIONS

Statutory Invention Registration No. H1399, Appln. No. 86,583, published Jan. 3, 1995; Inventors: Gregory Kozlowski, William E. Endres.

Kozlowski et al, Stability of growing front of $YBa_2Cu_3O_x$ superconductor in the presence of Pt and $CeO_2$ additions, *Appl. Phys. Lett.* 67 (2), Jul. 10, 1995, pp. 288–290.

Chen et al, "A new method for net-shape forming of large, single-domain $YBa_2Cu_3O_{6+x}$", *Physica C* 234 (1994), pp. 232–236.

Vuong et al, Supercond. Sci. Technol. 6 (1993) pp. 453–459.

Foltyn et al, Appl. Phys. Lett. 63(13), Sep. 1993, pp. 1848–1850.

Qiu et al, J. Appl. Phys. 70(4), Aug. 1991, pp. 2461–2463.

Wang et al, Jpn. J. Appl. Phys. vol. 27, No. 7, Jul. 1988, pp. L1268–L1270.

*Primary Examiner*—Roy V. King
*Attorney, Agent, or Firm*—Killworth, Gottman, Hagan & Schaeff, L.L.P.

[57] ABSTRACT

A method is provided for producing polycrystalline superconductor materials which utilizes a zdense and non-polluting 211 substrate which has been pre-sintered prior to melt processing with a 123 superconducting material. The resulting melt-processed material may be fabricated into a 123 superconductor having a single crystal size of up to 60 mm long which can carry very high current of up to about 1,500 A at 1 μV/cm criterion.

14 Claims, No Drawings

METHOD OF PRODUCING MELT-PROCESSED POLYCRYSTALLINE $YBA_2CU_3O_y$ (123) SUPERCONDUCTORS

BACKGROUND OF THE INVENTION

The present invention relates to the production of polycrystalline $YBa_2Cu_3O_y$ (123) superconductors, and more particularly, to a method which utilizes a pre-sintered 211 substrate in a melt processing technique to form a 123 superconductor having randomly oriented grains which can carry a high current.

The development of high $T_c$ superconducting materials has generated wide interest in recent years because of their potential in the manufacture of devices which are very efficient in their use of energy. For example, ceramic superconductors have potential use in bulk applications such as high-field magnets, energy storage devices, downleads, bearings and flywheels. However, many problems exist in providing commercially applicable products which use ceramic superconductors in the form of large bulk specimens.

For example, the superconducting compound $YBa_2Cu_3O_y$ (123) typically has a low critical current density due to its weak-linked, high-angle grain boundaries. In order to avoid such high-angle grain boundaries and still be able to carry high current, the 123 superconducting material must be texturized. A common method of providing such texturization to large 123 superconducting samples has been a melt-processing technique which involves a peritectic recombination reaction between the Ba-Cu-O molten phase and the $Y_2BaCuO_5$ (211) solid phase. However, the large samples are generally placed on substrates which react with the superconducting phase, resulting in the pollution of the superconductor and degradation of its electromagnetic properties. For example, a highly reactive Ba-Cu-O phase forms $BaZrO_3$ or $BaAl_2O_4$ when polycrystalline ceramic materials such as yttrium stabilized $ZrO_2$ or $Al_2O_3$ are used as a substrate, respectively. In addition, an egression of the liquid phase often occurs from the 123 sample to the 211 substrate which can cause cracks or distortions and lower the critical current density of the resulting superconductor.

Where the substrate is comprised of a MgO (001) single crystal, no wetting is observed in the presence of the Ba-Cu-O molten phase; however, a semi-continuous CuO-based liquid film occurs at the interface, causing partial contamination of the 123 phase.

Still other methods have been developed which include the use of non-polluting (non-reactive) substrates such as polycrystalline $Y_2O_3$. This substrate reacts with the Ba-Cu-O liquid above 1050° C., causing the formation of a 211 layer at the interface which functions as a seed for 123 crystal growth. However, such substrates have a low density, and an egression of the liquid phase still occurs with this method. Consequently, the resulting 123 superconductor is porous and has numerous cracks which substantially reduces the level of current which can pass through the specimen.

Accordingly, there is still a need in the art for a method of producing melt-processed superconducting materials having randomly oriented grains which can carry a high critical current and which may be used in a variety of bulk applications. There is a further need in the art for a dense and non-reactive substrate which can be melt-processed with a 123 superconducting material without the problem of liquid egression and without adversely affecting the properties of the resulting superconductor.

SUMMARY OF THE INVENTION

The present invention meets that need by providing a method of producing a 123 superconductor which utilizes a dense and non-reactive substrate which has been pre-sintered prior to melt processing with a 123 superconducting material. The resulting $YBa_2Cu_3O_y$ (123) superconductor has a single crystal size of up to 60 mm long which can carry very high electrical current and which may be used in a number of different applications.

According to one aspect of the present invention, a method is provided for producing a melt-processed polycrystalline $YBa_2Cu_3O_y$ (123) superconductor with randomly oriented grains comprising the steps of providing a $Y_2BaCuO_5$ (211) substrate and densifying the substrate by sintering the substrate at a temperature less than the second peritectic transition temperature of the $YBa_2Cu_3O_y$ (123) material. Preferably, the substrate is sintered at a temperature of between about 1250° C. and 1270° C. for a period of about 6 to 12 hours.

The 211 substrate is then cooled, and a 123 superconducting material is placed on the sintered 211 substrate. The 123 material and 211 substrate are then heated to a temperature to initiate peritectic melting of the 123 superconducting material. Preferably, the materials are heated to a temperature of about 1100° C.

The substrate and 123 material are then cooled to initiate recrystallization and then further cooled to room temperature. Preferably, the 211 substrate and 123 material are initially cooled to a temperature of about 1015° C. and then to 925° C. at a rate of about 1° C./hr., and further cooled to room temperature at a rate of about 240° C./hr.

The method may include the step of adding an additional material selected from the group consisting of platinum, silver, cerium oxide, 211 material or combinations thereof to the 123 material prior to the melt-processing step. The addition of these materials has been found to improve the critical current density and mechanical properties of the resulting superconductor. In a preferred embodiment, about 0.1% by weight platinum, about 15% by weight silver, and about 10% by weight 211 material is added to the 123 material prior to melt processing.

The resulting melt-processed superconductor has randomly oriented single crystals or domains of up to 60 mm in length which allow it to carry a high current of about 400 amperes (on average) at 10 μV/cm criterion. The superconductor may be used in a number of bulk applications including the production of downleads, flywheels, bearings, and superconducting wires.

Accordingly, it is a feature of the present invention to provide a method for producing a polycrystalline $YBa_2Cu_3O_y$ (123) superconductor which is melt-processed with a dense, pre-sintered 211 substrate. It is a further object of the invention to provide a 123 superconductor having large single crystal sizes which can carry high current. These, and other features and advantages of the present invention will become apparent from the following detailed description, accompanying drawing, and the appended claims.

DETAILED DESCRIPTION OF THE PREFERRED EMBODIMENT

The utilization of a densified, pre-sintered 211 substrate provides many advantages over prior art substrates which form an interface with the 123 material and result in a polluted 123 superconductor. The pre-sintered 211 substrate is a non-reactive substrate and allows large areas of the 123 sample to be textured. The sintering of the 211 substrate provides multiple nucleation sites for crystal growth of the 123 phase during the melt processing step at the 211/123 interface.

The use of a pre-sintered 211 substrate also increases connectivity between platelets within the 123 grains as well as between the grains by removing liquid from the 123 superconductor or entrapping excess Ba-Cu-O liquid phase inside the grains instead of in the grain boundaries during melt processing.

The 211 substrate is preferably prepared from a powder (99.9% purity) (commercially available from SSC, Inc.) by uniaxial loading. Preferably, the 211 substrate is pressed to a shape which matches the shape of the 123 specimen which is to be used during melt processing.

The sintering temperature of the 211 substrate is chosen so as not to exceed a second peritectic transition for the superconducting material, which has a $T_{p2}=1270°$ C. Accordingly, the preferred sintering temperature is from about 1250° C. to 1270° C. Densification of the 211 substrate may be increased not only by increasing the sintering temperature but also by increasing the pressure during initial shaping. After sintering, the 211 substrate is then cooled to room temperature at about 240° C./hr. The resulting 211 substrate may have grain sizes of up to 50 μm.

The 123 material used in the present invention is preferably formed from a 123 powder of 99.9% purity which is pre-sintered twice at 850° C. and 900° C. for a period of 24 hours. A suitable powder is commercially available from SSC, Inc. and has a particle size of from 2–5 μm. The powder is then pressed with a load of 20,000 lbs. in a steel die to the desired shape, such as a pellet, rod or bar (which matches the shape of the 211 substrate).

If desired, additional materials such as platinum, silver, cerium oxide, 211 material, or combinations thereof may be mixed with the 123 powder prior to pressing. Such materials improve the critical current density and mechanical properties of the superconductor. For example, the addition of platinum or cerium oxide has been found to help prevent liquid egression, the use of 211 material has been found to increase the critical current density, and the addition of silver provides mechanical strength to the superconductor.

The pressed 123 specimen is then preferably sintered at 950° C. for 24 hours and cooled prior to melt processing. The 123 specimen is then placed on the pre-sintered 211 substrate and the materials are placed in a furnace and heated to a temperature of about 1100° C.

The 211 substrate and 123 material are then cooled to a temperature of about 1015° C. and then to 925° C. at a rate of about 1° C./hr. to initiate recrystallization. The materials are then further cooled to room temperature at a rate of about 240° C./hr.

The grains of the resulting superconductor contain 123 phase as a result of the reaction of the liquid ($CuO+BaCuO_2$) with the 211 phase during cooling to room temperature. The total transport current passed through the resulting 123 superconductor is about 400 amperes at 10 μV/cm criterion, suggesting very good connectivity between grains.

In order that the invention may be more readily understood, reference is made to the following examples, which are intended to be illustrative of the invention, but are not intended to be limiting in scope.

EXAMPLE 1

Melt-processed 123 superconductors were prepared in accordance with the present invention by first sintering 211 substrates. The substrates were obtained from 211 powder (from SSC, Inc.) by pressing into 3 g and 7 g bars having dimensions (width and length) of 0.5×2.0 inch$^2$ and 0.5×4.0 inch$^2$, respectively. The substrates were then sintered at a temperature of 1250° C. for 12 hours.

The 15 g bars (0.125×0.5×2.0 inch$^3$) and 25 g bars (0.125×0.5×4.0 inch$^3$) of 123 were then prepared. The bars were prepared from a powder having a particle size of from 2–5 μm (SSC, Inc.) which was mixed separately with Pt powder (99.99% purity from Johnson-Mathey Co.), Ag powder (Aldrich Chemical Co.), and 211 material (SSC, Inc.) using a mortar and pestle. The powders were pressed in a steel die to the shape of bars and sintered at 950° C. for 24 hours.

The 123 bars were then placed on the pre-sintered 211 substrates. The samples were inserted in a preheated box furnace at 1100° C., held for 0.2 hours after the temperature stabilized, and then slowly cooled at a rate of 1° C./hr. from 1015° C. to 925° C. followed by a fast cooling at a rate of 240° C./hr. to reach room temperature.

A processed sample is highly texturized. The measured critical current ($I_c$) for the resulting 123 bars is shown below in Table I.

TABLE I

| Sample | Additions to 123 sample (wt. %) | Length of 123 bars (in.) | Critical current $I_c$ (A) 1 μV/cm | 10 μV/cm |
|---|---|---|---|---|
| 1 | 0.1 Pt + 15 Ag | 2 (multi-domain) | 120 | 510 |
| 2 | 15 Ag | 2 (multi-domain) | 94 | 340 |
| 3 | 10 (211) + 0.5 Pt + 15 Ag | 2 (multi-domain) | 73 | 300 |
| 4 | 10 (211) + 0.5 Pt + 15 Ag | 4 (multi-domain) | 114 | 460 |
| 5 | 0.1 Pt | 2 (single-domain) | 1,500 | >2,000 |

As can be seen, the 123 bars with 15 wt.% Ag exhibit good consistency and carried $I_c$~100 A at 1 μV/cm criterion and ~400 A at 10 μV/cm criterion regardless of the composition and length of the bars. In addition, a substantial increase in values of the critical current was observed in the bars with Pt and/or 211 additions with the maximum value of 1,500 A at 1 μV/cm criterion for a 123+0.1wt. % Pt superconducting bar.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A method of producing a melt-processed polycrystalline $YBa_2Cu_3O_y$ superconductor with randomly oriented grains comprising the steps of:

providing a $Y_2BaCuO_5$ (211) substrate;

densifying said 211 substrate by sintering said substrate at a temperature less than the second peritectic transition temperature of $YBa_2Cu_3O_y$ (123);

cooling said 211 substrate;

placing a 123 superconducting material on said sintered 211 substrate;

heating said 123 material and said 211 substrate to a temperature to initiate peritectic melting of said 123 superconducting material;

cooling said 211 substrate and 123 material to initiate recrystallization; and further cooling said 211 substrate and 123 material to room temperature.

2. The method of claim 1 in which said melt-processed superconductor has a single crystal size of up to about 60 mm in length.

3. The method of claim 1 in which said 211 substrate is sintered for about 6 to 12 hours.

4. The method of claim 1 in which said 211 substrate is sintered at a temperature of between about 1250° C. and 1270° C.

5. The method of claim 1 in which said 123 material and said 211 substrate are heated to a temperature of about 1100° C.

6. The method of claim 1 in which said 211 substrate and said 123 material are cooled to a temperature of about 1015° C. and then to about 925° C. at a rate of about 1° C./hr, and further cooled to room temperature at a rate of about 240° C./hr.

7. The method of claim 1 including the step of adding an additional material selected from the group consisting of platinum, silver, cerium oxide, 211 material or combinations thereof to said 123 material prior to said heating step.

8. The method of claim 7 in which about 0.1% by weight platinum, about 15% by weight silver, and about 10% by weight 211 material is added to said 123 material.

9. A melt-processed $YBa_2Cu_3O_y$ polycrystalline superconductor for bulk applications produced by following process OF:

providing a $YBaCuO_5$ (211) substrate;

densifying said 211 substrate by sintering said substrate at a temperature less than the second peritectic transition temperature of $YBa_2Cu_3O_y$ (123);

cooling said 211 substrate;

placing a 123 superconducting material on said sintered 211 substrate;

heating said 123 superconducting material and said 211 substrate to a temperature to initiate peritectic melting of said 123 superconducting material;

cooling said 211 substrate and said 123 superconducting material to initiate recrystallization; and further cooling said 211 substrate and said 123 superconducting material to room temperature.

10. The superconductor of claim 9 in which said superconductor has a single crystal size of up to about 60 mm in length.

11. The superconductor of claim 9 wherein the process further includes the step of adding an additional material selected from the group consisting of platinum, silver, cerium oxide, 211 material and combinations thereof to said 123 material prior to said heating step.

12. The superconductor of claim 11 in which about 0.1% by weight platinum, about 15% by weight silver and about 10% by weight 211 material is added to said 123 material.

13. The superconductor of claim 9 in which said 211 substrate and said 123 material are cooled to a temperature of about 1015° C. and then to about 925° C. at a rate of about 1° C./hour and further cooled to room temperature at a rate of about 240° C./hour.

14. The superconductor of claim 13 in which said superconductor carries a current of about 400 amperes at 10 µV/cm criterion.

* * * * *